Figure 1:
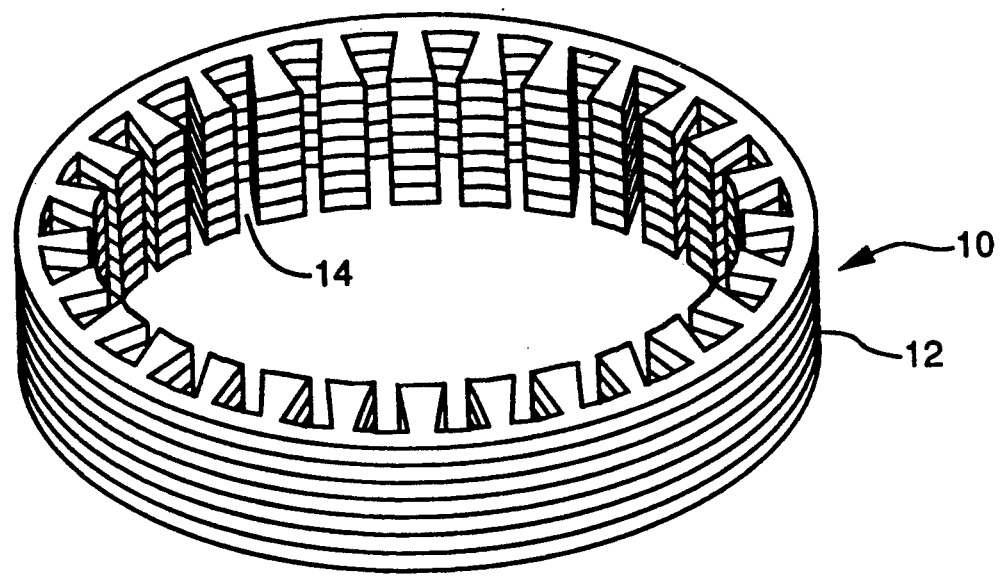

United States Patent [19]

Waldsmith

[11] Patent Number: 5,199,159
[45] Date of Patent: Apr. 6, 1993

[54] METHODS FOR CRYOGENIC REMOVAL OF EPOXY/WIRE FIELD WINDINGS AND FOR SEPARATING MULTI-LAYER PRINTED CIRCUIT WIRING BOARDS

[75] Inventor: Gary R. Waldsmith, Pilot Hill, Calif.

[73] Assignee: The United States of America as represented by the Secretary of the Air Force, Washington, D.C.

[21] Appl. No.: 796,115

[22] Filed: Nov. 20, 1991

Related U.S. Application Data

[63] Continuation-in-part of Ser. No. 648,071, Jan. 31, 1991, Pat. No. 5,070,603.

[51] Int. Cl.⁵ ........................ H02K 15/02; B23P 19/04
[52] U.S. Cl. .............................................. 29/596; 29/598; 29/426.4; 29/426.5; 29/762; 225/93.5; 156/344
[58] Field of Search ................. 29/426.1, 426.4, 426.5, 29/596, 598, 762, 806; 225/93.5; 62/62, 63; 156/344; 241/DIG. 37

[56] References Cited

U.S. PATENT DOCUMENTS

| | | | |
|---|---|---|---|
| 3,146,520 | 9/1964 | D'Eustachio | 29/762 |
| 3,215,345 | 11/1965 | Ferguson | 225/93.5 |
| 3,615,960 | 10/1971 | Hoshii | 225/93.5 |
| 4,274,576 | 6/1981 | Shariff | 29/426.4 |
| 4,549,741 | 10/1985 | Usher et al. | 277/206 |
| 4,623,255 | 11/1986 | Suszko | 356/389 |
| 4,766,516 | 8/1988 | Ozdemir et al. | 361/380 |
| 4,969,247 | 11/1990 | Rossi | 29/426.5 |
| 5,070,603 | 12/1991 | Waldsmith | 29/426.4 |

Primary Examiner—P. W. Echols
Attorney, Agent, or Firm—Irwin P. Garfinkle; Donald J. Singer

[57] ABSTRACT

A method of separating structure comprising first and second components having different coefficients of thermal expansion and bonded together with a bonding material. Separation is achieved by immersing the structure in a cryogenic cooling substance to break the bonding material as a result of the different rates of expansion of the two components and then applying a force to separate the two components. Separation of a rotor and its windings is disclosed.

6 Claims, 1 Drawing Sheet

METHODS FOR CRYOGENIC REMOVAL OF EPOXY/WIRE FIELD WINDINGS AND FOR SEPARATING MULTI-LAYER PRINTED CIRCUIT WIRING BOARDS

STATEMENT OF GOVERNMENT INTEREST

The invention described herein may be manufactured and used by or for the Government for governmental purposes without the payment of any royalty thereon.

BACKGROUND OF THE INVENTION

This is a continuation-in-part of application Ser. No. 07/648,071 filed Jan. 31, 1991, entitled A METHOD OF SEPARATING MULTI-LAYER PRINTED CIRCUIT WIRING BOARDS, now U.S. Pat. No. 5,070,603.

The prior parent patent application Ser. No. 07/648,071 related generally to a method of separating printed circuit wiring boards and, more particularly, to a method of cyrogenically separating multi-layer printed circuit wiring boards without damaging the printed circuit on the individual layers. The present additional disclosure involves the application of certain principles of parent application to the cryogenic removal of the field windings of a generator or motor.

The state of the art of printed circuit wiring board separation is well represented and alleviated to some degree by the prior art apparatus and approaches which are contained in the following U.S. Patents:

U.S. Pat. No. 4,623,255 issued to Suszko on Nov. 18, 1986; and

U.S. Pat. No. 4,766,516 issued to Ozdemir et al on Aug. 23, 1988.

The Suszko patent is an example of the multi-layer nature of printed circuit wiring boards. The examination of microstructures of LSI and VLSI devices is facilitated by employing a method in which the device is photographed through a darkfield illumination optical microscope and the resulting negative subjected to inverse processing to form a positive on a photographic film. The film is then developed to form photographic prints or transparencies which clearly illustrate the structure of the device. The entire structure of a device may be examined by alternately photographing the device and selectively etching layers of the device in order to expose underlying layers.

The Ozdemir et al patent discusses the method and apparatus for securing integrated circuits from unauthorized copying and use wherein at least one additional circuit element that does not contribute toward the integrated circuit's circuit function, but inhibits proper functioning of the integrated circuit in case of an attempted copying or other unauthorized use. The identity of the additional circuit elements is disguised by the visible appearance of an apparent element but with a physical modification which is not readily visible but causes them to function in a different manner, by providing different ICs with unique control codes, or both. Physical modifications not readily visible to a copyist include very narrow open circuit cuts in metalized connection lines, preferably with a focused ion beam or laser beam; and/or disordering the lattice structure or changing the doping level of a semiconductor region, and/or injecting electrical charge into a semiconductor region, preferably with an electron beam. The additional elements can be formed into a control code subcircuit for the IC, with the code disguised by the use of apparent elements.

Many older printed circuit wiring boards are lacking the necessary data for reproducing large quantities of these boards during surge requirements. In many cases, the companies that produced the boards originally are no longer in business or no longer possess the engineering data to manufacture the printed circuit wiring boards again. The only alternative is to reverse engineer an existing printed circuit wiring board. This usually can be accomplished, however, it generally involves a very large cost expenditure in both time and manpower. Thus, it is quite clear that there exists a critical need to find a fast, cost-effective way to reproduce the needed engineering data to reproduce and manufacture new printed circuit wiring boards.

It is therefore very critical in the reproduction and duplication of older printed circuit wiring boards, particularly boards which are multi-layered, that an accurate specimen or model of an original board be produced. The separation of multi-layered printed circuit wiring boards poses a number of great difficulties in the process of obtaining an accurate model of an out of production board. The process of separating or splitting a multi-layered board may totally destroy the only existing board of a particular type or class. It is therefore quite clear that there is a great need to provide a method of separating multi-layered printed circuit wiring boards accurately and without damage to any of the separated layers.

While the above-cited references are instructive, there still remains a need to provide a method of cryogenically separating/splitting multi-layer printed circuit wiring boards to provide a reproducible model in order to produce an exact replica of the original board. The present invention is intended to satisfy that need.

No prior art patent is known relating to the removal of epoxy bonded field windings without the likelihood of the destruction of rotor or stator discs in which the field windings are placed. The only methods for the removal of field windings known to applicant require the use of a burnout oven, or the use of chemical strippers. This cryogenic process for the removal of wiring eliminates the use of a burnout oven (800° F. 6–8 hrs) which produces high rotor failure rate and is a major contributor to the generation of environmental airborne pollutants. The process of chemical stripping compounds to soften and remove the insulating epoxy molding the copper wires woven through the stacked laminate material, i.e., the magnetic core of a generator or motor, produces outgasses for a prolonged period of time, which produces a health hazard and hazardous waste stream. In accordance with this process, and due to a 3 to 1 expansion rate between steel and copper, immersing the part in liquid nitrogen (LN2) produces a change in temperature of 300° F. and a resulant stress of sufficient strength to sever, or fracture the epoxy/steel bond in the laminated core allowing the copper wiring bundle to be easily driven out of the pie shaped slots of the core.

SUMMARY OF THE INVENTION

The invention disclosed in the parent application Ser. No. 07/468,071 is a method of cryogenically separating/splitting multi-layered printed circuit wiring boards to produce individual board layers from which finished artwork that is exactly identical to the original may be obtained. The cryogenic method is utilized to cool the multi-layered board to the point where the adhesive binding properties of the material that is holding the multi-layers together is altered to the point of allowing physical separation of the individual layers. The additional disclosure herein utilizes the cryogenic cooling concept to effect the removal of the epoxy bonded wiring from the rotor or stator of a generator or motor.

It was one object of the parent application to provide an improved method of separating multi-layer printed circuit wiring boards.

It is another object of the invention of the parent application to provide an improved method of separating multi-layer printed circuit wiring boards to provide an exact reproducible specimen of each board layer for the original multi-layer printed circuit wiring board.

It was still another object of the the parent application to provide an improved method of separating multi-layer printed circuit wiring boards wherein the bonding material between the multi-layers of the wiring board is cryogenically altered to allow the physical separation of the individual board layers.

It was yet another object of the invention of the parent application to provide an improved method of separating multi-layer printed circuit wiring boards wherein undamaged and photographically reproducible board layers are obtained from multi-layered printed circuit wiring boards.

It is an additional object of this continuation-in-part to provide a method that eliminates the use of the known processes for separating windings from the stators and rotors of generators and motors by the use of cryogenic cooling.

Figure 2:
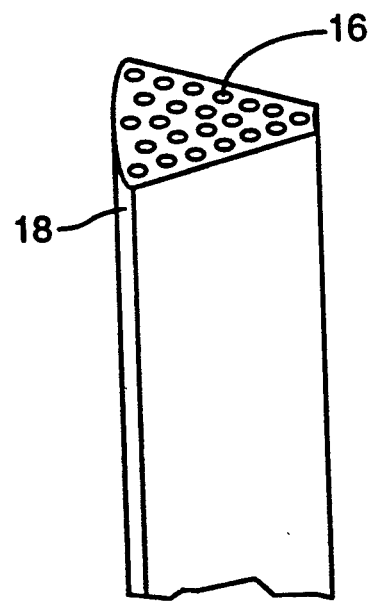

These and other advantages, objects and features of the invention will become more apparent after considering the following description taken in conjunction with the accompanying drawings in which:

FIG. 1 schematically illustrates the magnetic core of the stator or rotor of an electromotive machine such as a generator or motor; and FIG. 2 shows the windings of the machine removed from the core.

DETAILED DESCRIPTION OF THE PREFERRED EMBODIMENT FOR SEPARATING MULTI LAYERED PRINTED CIRCUIT WIRING BOARDS

The method of separating or splitting a multi-layer printed circuit wiring board into individually, undamaged board layers is accomplished by the careful execution of the following method steps. Since the separation/splitting procedure involves the use of a cryogenic cooling substance, such as liquid nitrogen (LN2) the following precautions are suggested and necessary. Some form of eye protection must be used when working with a cryogenic cooling substance such as liquid nitrogen. While the eye protection may be any suitable commercially available protection, it should be noted that jeweler's binocular with a magnification power of 10× has been utilized effectively.

Since the procedure for separating/splitting multi-layer printed circuit wiring boards involves the use of materials that are cooled to extremely low temperatures, it is recommended that suitable leather gloves be worn by the method operator in order to protect ones fingers and hands from the extreme cold. Furthermore, the cryogenic cooling substance should be carefully stored in suitably sturdy containers to prevent accidental injury to operating personnel. In the situation where liquid nitrogen is utilized as the cooling substance, styrofoam containers may be utilized to process larger printed circuit wiring boards when one is unable or it is difficult to find or acquire a container of the proper shape to hold and process layer circuit boards.

The method of separating/splitting multi-layer printed circuit wiring boards is accomplished as follows:

1. Place the area of interest of the multi-layer board which is to be separated/split into a container containing a cryogenical cooling substance, such as liquid nitrogen, LN-2.

a. Ensure that this area is completely involved or covered by the cryogenic cooling substance.

b. The printed circuit wiring board will add heat into the cryogenic cooling system as it is cooled. This added heat will cause the cryogenic cooling substance to boil until the board and the cryogenic cooling substance are at the same temperature. At this point, the multi-layer board has been cooled to the point where the hold or binding properties of the adhesive material between the multi-layers has been altered so as to permit the physical separation of the individual board layers.

c. Place the board separating utensile (i.e., a surgical knife) into the cryogenic cooling substance to cool the tip of the knife at the same time simultaneously with the board so that both will be substantially the same temperature.

2. Remove both the printed circuit wiring board and the surgical knife from cryogenic cooling substance at the termination of boiling.

3. In preparation of the board separation procedure, hold the board at an appropriate angle and proceed to split the first layer away from the main body of the board.

a. Take extreme care to ensure that you only separate off the one layer. Do not include any of the next group of sublayers of material which make up the board's separating or insulating material between circuits.

b. It will be necessary to recool the blade and the board as often as needed during the separation process. This point will be easily recognized by increased degree of difficulty in separating the board layers.

c. This process should be repeated as often as needed to slowly separate off this first layer.

It is important to note that the bonding medium which is holding the different layers together will become stronger as the circuit board warms up. It is imperative that a person develops a feel for this characteristic by practicing this process so that they will know when to recool the board and knife blade before the board starts to tear or split.

4. The separation process will proceed slowly until a plated through copper mounting hole is encountered. To easily separate the board around the plated through hole any of the following steps or procedures may be utilized:

a. Insert a drill bit one or two thousand larger than the hole diameter to remove the copper plating.

b. On the larger holes, a pointed long tapered round jewelers' file may be used to remove a portion of the copper collars' edge at the board/hole intersection.

c. The separation process may also be accelerated by using a small jeweler's screwdriver to pop loose these copper collars on the board. With the screwdriver next to the hole slowly rock the blade of screwdriver back and forth and the collar will pop loose.

d. If the above steps or methods do not break loose the board/hole interface it is necessary to use the smallest cutting chisel as possible and gently tap the chisel through the copper. At this point, it is essential to insure that the chisel tip is precooled before using or repeating this step of chiseling through a copper rivet or plated through hole.

5. This process cannot be rushed. Trying to speed the process may result in damaged and un-usable circuit board layers. The whole process is a slow one, and practice by the technician is essential to develop a feel for the recooling intervals.

6. After the first layer has been separated from the printed circuit wiring board, proceed to the next layer and repeat the process until all the layers are separated from each other.

An example of the types of tools which are needed to accomplish the procedure for multi-layer board separation are listed below:

10× Jewelers' Binoculars
Styrofoam container
Surgical knife with replaceable blades
Leather gloves
Hammer, small
Jewelers' screwdrivers' (one set)
Jewelers' files' (one set)
Jewelers' chisels' (one set)

DETAILED DESCRIPTION OF THE PREFERRED EMBODIMENT OF THE INVENTION FOR SEPARATING COPPER WIRING FROM THE MAGNETIC CORE OF AN ELECTROMAGNETIC MACHINE

Referring to the drawings, FIG. 1 shows a conventional magnetic core 10 of the rotor or stator of an electromagnetic machine, such as a generator or motor. The core 10 is comprised of a stack of laminated magnetic discs 12 formed with pie-shaped slots 14 aligned to contain pie-shaped bundles of wiring 16, shown in FIG. 2 after removal from the slots 14.

The discs 12 are made of magnetic iron or steel and are bonded together by conventional means. The wiring 16 is also conventional, that is, the wiring is continuous and it loops from slot to slot around the entire core 10. The wiring 16 within the slots 14 is embedded in an epoxy 18 and coated with a thin Kapton or other insulator (not shown). The wiring shown in FIG. 2 is depicted after removal from the slots 14 of the core 10. Removal of the core was preceded by the cutting of the wiring flush with the top and bottom of the core. In its normal condition, the bundle of wiring 16 and the core have an epoxy to steel bond which must be broken in order to remove the wiring bundles from the slots.

The purpose of this process is to remove wiring which is defective, while preserving the core 10 for re-use. The process for the removal of the wiring is as follows:

1. Cut the top and bottom of the wiring 16 as close to the surface of the core 10 as possible.
2. Fill an insulated container with a cryogenic cooling substance, preferably liquid nitrogen, LN2.
3. Immerse the core with the embedded wiring into the cooling substance (liquid nitrogen) for a period of approximately 5 minutes.
4. Remove the core and wiring from the liquid nitrogen.
5. Place the core and wiring into a warm (approximately 100° F.) drying oven for approximately 2 hours.
6. Remove core and wiring from the drying oven and place the core on a stand.
7. Drive out the wedge shaped bundles with a punch.

This process eliminates the use of a burnout oven which operates at 800 degrees F. for 6-8 hours and which produces high failure rates of the rotor and stator cores. In addition, the burnout oven is a major contributor to the environmental airborne pollutants generated at the process sites. The disclosed process also eliminates the use of chemical stripping of compounds to soften and remove the insulating epoxy which molds the copper wires woven through the stacked laminate material of the core. The chemical strippers produce toxic gases for prolonged periods of time, creating a health hazard and a hazardous waste stream.

In accordance with the disclosed process, due to a 3 to 1 expansion rate between the steel core and the epoxy enclosed bundle of copper wiring, immersing the part in liquid nitrogen produces a change in temperature of 300 degrees F., and a resultant stress sufficient to sever or fracture the epoxy to steel bond in the laminated core, thereby allowing the copper wiring bundle to be easily driven out of the pie shaped slots of the core.

The liquid nitrogen process has been successfully demonstrated at the McClellan Air Force Base in California to remove the copper winding on the F-15 A/C excitor armature, Part No. 31169-1380, excitor rotor part no. 31109-1720, excitor part no. 31169-1100, and the F-15 emergency Ram Air Turbine Stator part no. 1585570-1. The current processes (the burnout and chemical stripping processes) are both costly and labor intensive, and have resulted in the damage or destruction of a large number of parts. The use of the present liquid nitrogen process eliminated substantially all losses due to damage during the winding removal, and the process resulted in a very substantial saving in time.

Although the invention has been described with reference to particular embodiments, it will be understood to those skilled in the art that the invention is capable of a variety of alternative embodiments within the spirit and scope of the appended claims.

What is claimed is:

1. A method of separating structure comprising first and second components which are bonded together by means of bonding material, said components having different rates of thermal expansion and contraction comprising:
   1. filling a container with a cryogenic cooling substance, said liquid being at a temperature of approximately −170° F. centigrade;
   2. immersing said structure in said cryogenic cooling substance, to break the bond of the bonding material between the first and second components through said different rates of thermal expansion and contraction of said components;
   3. removing said structure from said cooling substance when said bond is broken; and
   4. applying a separating force to said first and second components until the components are separated.

2. The method of claim 1 wherein said first structure comprises epoxy embedded wiring, and said second structure comprises a stack of bonded discs of magnetic material having aligned slots, said epoxy embedded wiring being bonded within said slots.

3. The method of claim 1, and then following the step 3, the placing of said structures are in an oven at 100° F. for approximately 2 hours.

4. The method of claim 3, wherein said cooling substance is liquid nitrogen, and wherein said structure is immersed in said liquid nitrogen for a period of approximately 5 minutes.

5. A method of separating the windings from the cylindrical core of an elctromagnetic machine, said windings being wound conventionally around said magnetic core and being embedded in an epoxy wedge and bonded within slots in the core, said wiring said core having different rates of expansion and contraction in response to changes in temperature, said method comprising the steps of:
   1. cutting the top and bottom of the wiring as close to the surface of the core as possible to make the winding flush with the top and bottom of the cylindrical core;
   2. filling an insulated container with a cryogenic cooling substance;
   3. immersing the core with embedded wiring into the cooling substance for a period of approximately 5 minutes;
   4. removing the core and wiring from the cooling substance;
   5. placing the core and wiring into a warm (approximately 100° F.) drying oven for approximately 2 hours;
   6. removing the core and wiring from the drying oven and placing the core on a stand; and
   7. driving out the wedge shaped bundles with a punch.

6. The method of claim 5, wherein said cooling substance is liquid nitrogen.

* * * * *